United States Patent
Huang et al.

(10) Patent No.: US 12,387,134 B2
(45) Date of Patent: Aug. 12, 2025

(54) DATA CAPTURE AND TRANSFORMATION TO SUPPORT DATA ANALYSIS AND MACHINE LEARNING FOR SUBSTRATE MANUFACTURING SYSTEMS

(71) Applicant: LAM RESEARCH CORPORATION, Fremont, CA (US)

(72) Inventors: Chung-Ho Huang, San Jose, CA (US); Vincent Wong, Fremont, CA (US); Paul Ronald Ballintine, Pleasanton, CA (US); Henry Chan, Morgan Hill, CA (US); Nicolas Grinschgl, Riegersdorf (AT); John A. Jensen, Alameda, CA (US); Chad Russell Weetman, Pleasanton, CA (US); Rainer Unterguggenberger, Newark, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 1032 days.

(21) Appl. No.: 17/429,687

(22) PCT Filed: Feb. 11, 2020

(86) PCT No.: PCT/US2020/017606
§ 371 (c)(1),
(2) Date: Aug. 10, 2021

(87) PCT Pub. No.: WO2020/167720
PCT Pub. Date: Aug. 20, 2020

(65) Prior Publication Data
US 2022/0206996 A1 Jun. 30, 2022

Related U.S. Application Data

(60) Provisional application No. 62/805,454, filed on Feb. 14, 2019.

(51) Int. Cl.
*G06N 20/00* (2019.01)
*G06F 16/11* (2019.01)
(Continued)

(52) U.S. Cl.
CPC .......... *G06N 20/00* (2019.01); *G06F 16/122* (2019.01); *G06F 16/176* (2019.01); *H01L 21/00* (2013.01);
(Continued)

(58) Field of Classification Search
CPC ...................................... G06N 20/00
(Continued)

(56) References Cited

U.S. PATENT DOCUMENTS 6,535,779 B1 * 3/2003 Birang ............... H01L 22/26
700/121
9,972,478 B2 5/2018 Guha et al.
(Continued)

FOREIGN PATENT DOCUMENTS

CN 107689318 A 2/2018
TW 201734434 A 10/2017

OTHER PUBLICATIONS

International Search Report and Written Opinion of the ISA issued in PCT/US2020/017606, mailed Jun. 8, 2020; ISA/KR.
(Continued)

*Primary Examiner* — Ruay Ho

(57) ABSTRACT

A data collection system for semiconductor manufacturing includes: T substrate processing tools, where each of the T substrate processing tools includes: N processing chambers, where each of the N processing chambers includes a processing chamber controller configured to receive a plurality of different types of data during operating of the corresponding one of the N processing chambers, where the plurality of different types of data have different formats, where the
(Continued)

processing chamber controller is further configured to format the plurality of different types of data into formatted data, and where T and N are integers; and a data diagnostic services computer configured to: receive and store the formatted data as categories in a common file having a table-like data structure including rows with contextual data; and in response to a request, generate an output file including a subset of the data from the common file.

20 Claims, 10 Drawing Sheets

(51) Int. Cl.
*G06F 16/176* (2019.01)
*H01L 21/00* (2006.01)
*H01L 21/67* (2006.01)
*H04L 67/06* (2022.01)

(52) U.S. Cl.
CPC ........ *H01L 21/67253* (2013.01); *H04L 67/06* (2013.01)

(58) Field of Classification Search
USPC ................ 706/12; 355/71; 118/728; 700/121
See application file for complete search history.

(56) References Cited

U.S. PATENT DOCUMENTS

| | | |
|---|---|---|
| 2003/0061212 A1 | 3/2003 | Smith et al. |
| 2004/0228339 A1 | 11/2004 | Gallo et al. |
| 2005/0140955 A1* | 6/2005 | Butler ................. G03F 7/70991 |
| | | 355/71 |
| 2006/0292846 A1* | 12/2006 | Pinto ................. H01L 21/76849 |
| | | 257/E21.295 |
| 2008/0040061 A1 | 2/2008 | Osada |
| 2009/0240366 A1 | 9/2009 | Kaushal et al. |
| 2013/0174102 A1 | 7/2013 | Leu |
| 2014/0349469 A1* | 11/2014 | Sasagawa ........... C23C 16/4583 |
| | | 118/728 |
| 2018/0265983 A1 | 9/2018 | Qian et al. |
| 2019/0097950 A1* | 3/2019 | Janhar ................. H04L 49/9047 |
| 2019/0171787 A1* | 6/2019 | Nurani ................... H01L 22/20 |
| 2020/0006100 A1* | 1/2020 | Clark ................. H01L 21/68707 |

OTHER PUBLICATIONS

Chinese Office Action and Search Report for corresponding Chinese Application No. 202080014714.1 dated May 14, 2024.
Taiwanese Office Action for corresponding Taiwanese Application No. 109104155 dated Mar. 25, 2024.

* cited by examiner

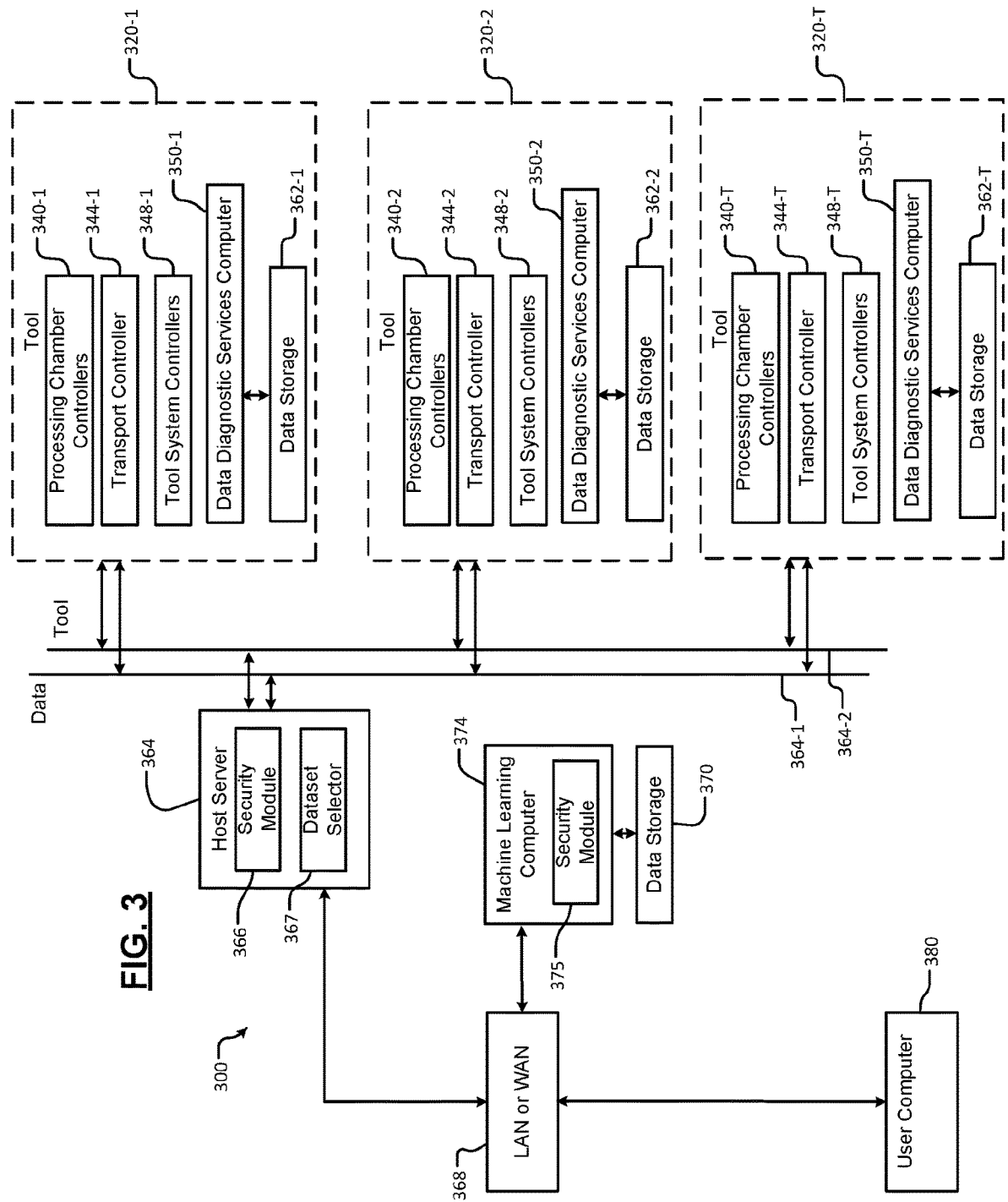

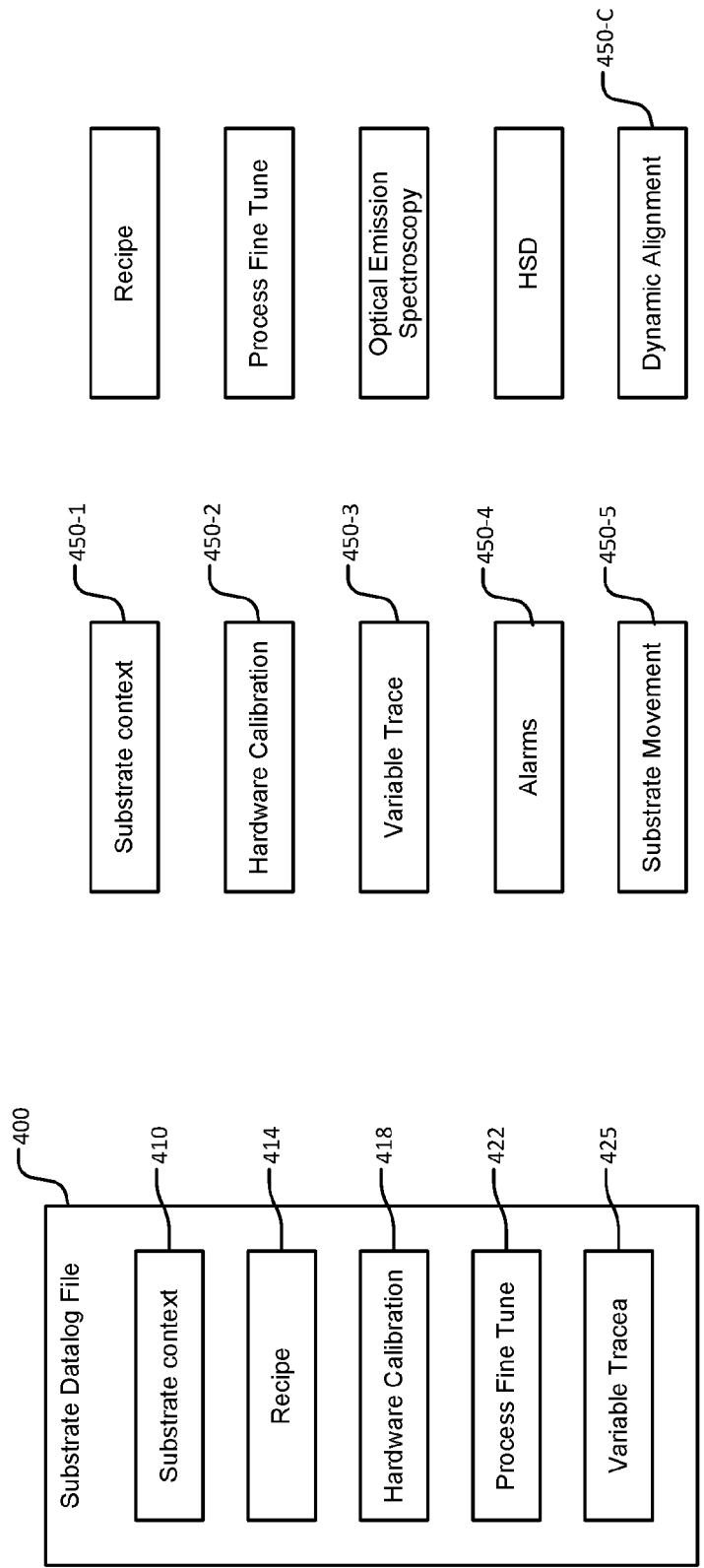

DATA CAPTURE AND TRANSFORMATION TO SUPPORT DATA ANALYSIS AND MACHINE LEARNING FOR SUBSTRATE MANUFACTURING SYSTEMS

CROSS-REFERENCE TO RELATED APPLICATIONS

The present disclosure is a U.S. National Phase Application under 35 U.S.C. 371 of International Application No. PCT/US2020/017606, filed on Feb. 11, 2020 which claims the benefit of U.S. Provisional Application No. 62/805,454 filed on Feb. 14, 2019. The entire disclosures of the applications referenced above are incorporated herein by reference.

FIELD

The present disclosure relates to substrate processing systems and more particularly to data capture and transformation to support data analysis and machine learning for substrate manufacturing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor manufacturers use one or more substrate processing tools to perform deposition, etching, cleaning and/or other substrate treatments during fabrication of semiconductor wafers. Each of the substrate processing tools may include a plurality of processing chambers that perform the same type of treatment (such as deposition, etching or cleaning) or different treatments such as a series or sequence of treatments.

The processing chambers in the substrate processing tools usually repeat the same task on multiple substrates. The processing chambers operate based on a recipe that defines process parameters. For example, a recipe defines sequencing, operating temperatures, pressures, gas chemistry, plasma usage, periods for each operation or sub-operation, and/or other parameters. When manufacturing variations and/or defects occur, the semiconductor manufacturer needs to determine the root cause.

SUMMARY

In a feature, a data collection system for semiconductor manufacturing includes: T substrate processing tools, where each of the T substrate processing tools includes: N processing chambers, where each of the N processing chambers includes a processing chamber controller configured to receive a plurality of different types of data during operating of the corresponding one of the N processing chambers, where the plurality of different types of data have different formats, where the processing chamber controller is further configured to format the plurality of different types of data into formatted data, and where T and N are integers; and a data diagnostic services computer configured to: receive and store the formatted data as categories in a common file having a table-like data structure including rows with contextual data; and in response to a request, generate an output file including a subset of the data from the common file.

In further features: the contextual data includes a material identification field and a time field; and the plurality of different types of data include at least three or more data types selected from a group consisting of recipes, hardware calibration, process fine-tuning, optical emission spectroscopy, high speed data, and variable traces.

In further features, the data diagnostic services computer is configured to generate the output file based on at least one of: a subset of the categories; a subset of the material identification field; and a subset of the time field.

In further features, the common file has a three-level hierarchy including file, group and category.

In further features, the common file has a technical data management solution (TDMS) format.

In further features, data is stored in the common file in binary format.

In further features, a machine learning computer is configured to communicate with the diagnostics data services computer and to perform machine learning on data in the output file.

In further features, the processing chamber controller includes: a data generating object configured to transmit the plurality of different data types; a data dispatcher configured to receive the plurality of different data types from the data generating object; a plurality of data sinks, wherein each of the plurality of data sinks is configured to receive a corresponding one of the plurality of different data types from the from the data dispatcher; a plurality of data formatters, wherein each of the plurality of data formatters is configured to receive the corresponding one of the plurality of different data types from the data sink and to output the formatted data back to the corresponding one of plurality of data sinks; and a data interface manager configured to forward the formatted data from the plurality of data sinks to the data diagnostics services computer.

In further features, the data diagnostic services computer includes: a data manager configured to receive the formatted data from the processing chamber controller; and a data store configured to store and control access to the common file.

In further features, a data adapter is configured to receive the request and to generate the output file.

In further features, the data adapter is further configured to adapt the output file to one of a plurality of data transporters.

In further features, the plurality of data transporters include at least one of a file transfer protocol (FTP) transporter, a machine learning transporter, and an archive transporter.

In further features: a host server including a file selector is configured to select R portions of data from R output files of R of the T substrate processing tools, where R is an integer greater than one and less than or equal to T; and a machine learning computer is configured to combine and perform machine learning on data in the R output files.

In further features, a data collection method for semiconductor manufacturing includes: receiving a plurality of different types of data during operating of ones of N processing chambers of T substrate processing tools, where T and N are integers greater than zero, and where the plurality of different types of data have different formats; formatting the plurality of different types of data into formatted data; storing the formatted data as categories in a common file having a table-like data structure including rows with contextual data; and in response to a request, generating an output file including a subset of th from the common file.

In further features: the contextual data includes a material identification field and a time field; and the plurality of different types of data comprise at least three or more data types selected from a group consisting of recipes, hardware calibration, process fine-tuning, optical emission spectroscopy, high speed data, and variable traces.

In further features, generating the output file includes generating the output file based on at least one of: a subset of the categories; a subset of the material identification field; and a subset of the time field.

In further features, the common file has a three-level hierarchy including file, group and category.

In further features, the common file has a technical data management solution (TDMS) format.

In further features, the data is stored in the common file in binary format.

In further features, the data collection method further includes performing machine learning on data in the output file.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 is a functional block diagram of an example of a data collection architecture for a substrate manufacturer according to the present disclosure;

FIGS. 4A to 4G are diagrams illustrating examples of data handling;

In the drawings, reference numbers may be reused to identify similar and/or identical elements.

DETAILED DESCRIPTION

Figure 1:
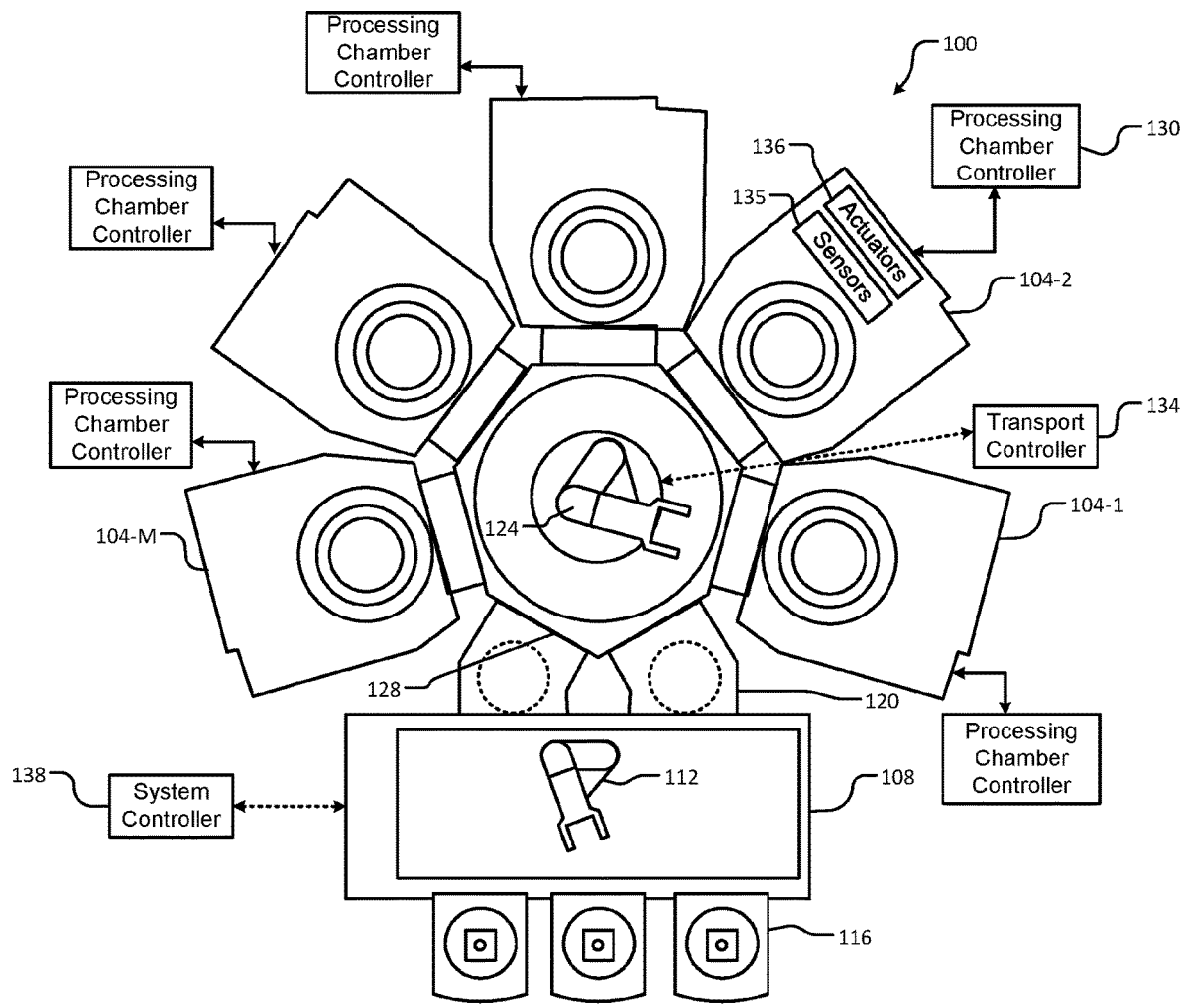
FIG. 1 is a functional block diagram of an example of a substrate processing tool including one or more processing chambers.

A significant amount of data such as structured data is generated during operation of the substrate processing tools. For example, to produce integrated circuits on a large scale, a semiconductor manufacturer may configure an array of substrate processing tools that are configured to fabricate semiconductor wafers. Since production uniformity is very important to reduce non-uniformity and/or defects, it is important to ensure that the same steps that are performed by each of the processing chambers in each of the substrate processing tools are performed in the same way to produce the same results. Substrate manufacturing requires precise control of process parameters. One way to identify the root cause of defects or non-uniformities is to compare process conditions for different substrates produced in the same processing chamber and/or different processing chambers.

The processing chambers typically include sensors to sense chamber parameters such as temperature profiles of an electrostatic chuck, optical emission spectroscopy (OES) data, recipes, pressures, etc. The data that is generated typically has a variety of different file formats such as binary, binary MOSS, ASCII, XML, TDMS, etc. Furthermore, there is a large volume of data that is generated by each processing chamber. For example, each processing chamber can produce about 2 MB per second of data during operation. When problems such as defects or non-uniformities arise in current systems, it is very difficult to retrieve the data, re-format the data into a usable format and analyze the data due to the way that is collected and stored.

Systems and methods according to the present disclosure provide a data collection architecture for receiving, formatting and organizing data produced by one or more substrate processing tools. The architecture allows the data to be collected across multiple processing chambers, substrate processing tools, and/or locations such that it can be analyzed more readily. In the description that follows, an example of a substrate processing tool and a processing chamber are initially described to provide context for the description of the architecture that follows.

During processing, the substrate is typically delivered to the substrate processing tool in a cassette. A transfer robot loads the substrate through a load lock into a transfer station. A vacuum robot moves the substrate from the cassette to load lock. The vacuum robot moves the substrate from the load lock into one of the processing chambers for processing. After processing in the processing chamber, the vacuum robot moves the substrate to another one of the processing chambers or back to the cassette via the load lock.

While in the processing chamber, the substrate is treated. For example, a temperature of the substrate may be controlled by a temperature controlled electrostatic chuck (ESC). Pressure in the processing chamber may be controlled. One or more gas mixtures including one or more precursors, inert gases, etch gases or other gas mixtures are introduced into the processing chamber. In some processes, plasma may be struck in the processing chamber or supplied from a remote plasma source to initiate chemical reactions. Other processes may not involve the use of plasma. An RF bias may be supplied to the substrate support to control ion energy.

Referring now to FIG. 1, an example substrate processing tool 100 is shown. The substrate processing tool 100 includes a plurality of processing chambers 104-1, 104-2, . . . and 104-M (collectively processing chambers 104) (where M is an integer greater than one). For example only, each of the processing chambers 104 may be configured to perform one or more types of substrate treatment. In other words, the substrates may be loaded into one of the processing chambers 104, processed, and then moved to one or more other one of the processing chambers 104 (if at least one performs a different treatment) and/or removed from the substrate processing tool 100 (if all perform the same treatment).

Substrates to be processed are loaded into the substrate processing tool 100 via ports of a loading station of an atmosphere-to-vacuum (ATV) transfer module 108. In some examples, the ATV transfer module 108 includes an equipment front end module (EFEM). The substrates are then transferred into one or more of the processing chambers 104. For example, a transfer robot 112 is arranged to transfer substrates from loading stations 116 to airlocks, or load locks, 120, and a vacuum transfer robot 124 of a vacuum transfer module 128 is arranged to transfer substrates from the load locks 120 to the various processing chambers 104.

Processing chamber controllers 130, a transport controller 134 and/or a system controller 138 may be provided. The transport controller 134 control robots 112 and 124, actuators and sensors related to the transportation of substrates to and from the processing tool 100. The processing chamber controllers 130 control operation of the processing chambers 104. Generally, the processing chamber controllers 130 monitor sensors 135 such as temperature sensors, pressure sensors, position sensors, etc. and control actuators 136 such as robots, ports, heaters, gas delivery systems, the ESC, RF generators, etc. The processing chamber controllers 130 associated with the processing chambers 104 generally follow a recipe that specifies the timing of steps, process gases to be supplied, temperature, pressure, RF power, etc.

Figure 2:
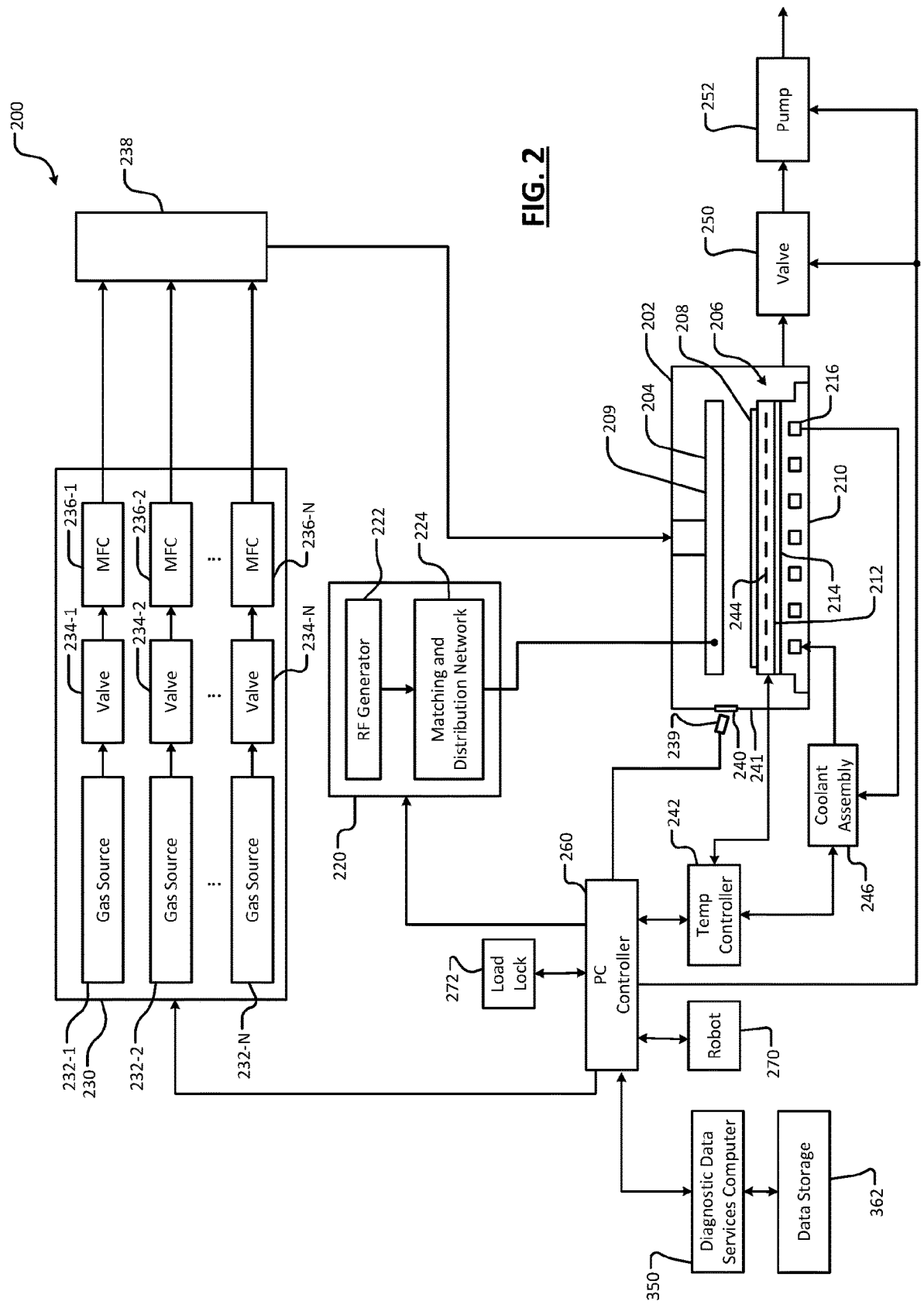
FIG. 2 is a functional block diagram of an example of a substrate processing chamber connected to a data diagnostic services computer according to the present disclosure.

Referring now to FIG. 2, an example substrate processing system 200 for treating a substrate is shown to illustrate examples of data types that are generated during operation of the processing chamber. While a specific type of processing chamber is shown, other types of processing chambers may be used. The substrate processing system 200 includes a processing chamber 202 that encloses other components of the substrate processing system 200 and contains the RF plasma. The substrate processing system 200 includes an upper electrode 204 and a substrate support, such as an electrostatic chuck (ESC) 206. During operation, a substrate 208 is arranged on the ESC 206.

For example only, the upper electrode 204 may include a showerhead 209 that introduces and distributes process gases such as deposition precursors, etch gases, carrier gases, etc. The ESC 206 includes a conductive baseplate 210 that acts as a lower electrode. The baseplate 210 supports a heating plate 212, which may correspond to a ceramic multi-zone heating plate. A thermal resistance layer 214 may be arranged between the heating plate 212 and the baseplate 210. The baseplate 210 may include one or more coolant channels 216 for flowing coolant through the baseplate 210.

An RF generating system 220 generates and outputs an RF voltage to one of the upper electrode 204 and the lower electrode (e.g., the baseplate 210 of the ESC 206). The other one of the upper electrode 204 and the baseplate 210 may be DC grounded, AC grounded or floating. For example only, the RF generating system 220 may include an RF voltage generator 222 that generates the RF voltage that is fed by a matching and distribution network 224 to the upper electrode 204 or the baseplate 210. In other examples, the plasma may be generated inductively or remotely.

A gas delivery system 230 includes one or more gas sources 232-1, 232-2, . . . , and 232-N (collectively gas sources 232), where N is an integer greater than zero. The gas sources 232 supply one or more deposition precursors, etching gases, carrier gases, etc. Vaporized precursor may also be used. The gas sources 232 are connected by valves 234-1, 234-2, . . . , and 234-N (collectively valves 234) and mass flow controllers 236-1, 236-2, . . . , and 236-N (collectively mass flow controllers 236) to a manifold 238. An output of the manifold 238 is fed to the processing chamber 202. For example only, the output of the manifold 238 is fed to the showerhead 209.

An optical emission spectroscopy (OES) sensor 239 may be arranged adjacent to a window 240 arranged on a chamber surface 241. The OES sensor 239 selectively generates OES data. A temperature controller 242 may be connected to a plurality of thermal control elements (TCEs) 244 arranged in the heating plate 212. For example, the TCEs 244 may include, but are not limited to, respective macro TCEs corresponding to each zone in a multi-zone heating plate and/or an array of micro TCEs disposed across multiple zones of a multi-zone heating plate. The temperature controller 242 may be used to control the plurality of TCEs 244 to control a temperature of the ESC 206 and the substrate 208.

The temperature controller 242 may communicate with a coolant assembly 246 to control coolant flow through the channels 216. For example, the coolant assembly 146 may include a coolant pump and reservoir. The temperature controller 242 operates the coolant assembly 246 to selectively flow the coolant through the channels 216 to cool the ESC 206.

A valve 250 and pump 252 may be used to evacuate reactants from the processing chamber 202. A controller 260 may be used to control components of the substrate processing system 200. A robot 270 may be used to deliver substrates onto, and remove substrates from, the ESC 206. For example, the robot 270 may transfer substrates between the ESC 206 and a load lock 272. Although shown as separate controllers, the temperature controller 242 may be implemented within the controller 260.

As can be appreciated, a significant amount of discrete data and streaming data is generated by the substrate processing tool during processing and transport of substrates. Event data can be used to determine the location and residence time in various components. For example, residence time in a module or FOUP may cause process differences between substrates. Systems logs record system level data. Additional data is recorded during substrate transport. Each of the processing chambers also records data during processing of the substrates. However, the data that is recorded includes different data types, sampling rates, and/or formats. Changing the data format will cause problems with respect to storage and retrieval of historical data. Furthermore, some of the data is only stored locally at the processing chamber while other data is stored at a fab level.

Data is usually streamed from the tool to a host in a message format at a fixed frequency. The data is generally not sent on a substrate basis. Rather the data is sent on a time basis. Data is typically collected in files based at a fixed frequency or file size. Data is usually collected continuously and has no bounds. In some systems, the data is collected during processing of an initial and final substrate at recipe start and recipe end, respectively, but not for intervening substrates.

The semiconductor manufacturer does not have easy access to all of the data in all its forms mentioned above using existing fab data collection methods. Therefore the semiconductor manufacturer is unable to extract a comprehensive holistic insight from the individual data segments to improve productivity, to diagnose problems and/or to make process improvements. In summary, the semiconductor manufacturer is unable to access fab data having a useable format and organization. Some of the data is not currently accessible to the semiconductor manufacturer. Many of data files are incomplete in its context information and/or lack consistency in timestamps or nomenclature used for the same subsystems.

To obtain insight, the semiconductor manufacturer may want to combine data from different files having different formats. Contextual data added to some data files is not consistent, which requires significant data wrangling to correct. Some of the data does not have sufficient quality to be relied upon.

Systems and methods according to the present disclosure capture, transport, store and/or transform data generated during substrate processing to allow subsequent analysis using big data tools and/or machine learning.

In some examples, the data has a common structured file format that supports encryption and forward/backward compatibility. In some examples, the data format is consistent with technical data management solution (TDMS) file format. In some examples, the data format is accessible and can be read by the customer using a key (e.g. an application protocol interface (API) key). The data context and collection are consistent across the different data types to allow usage without cleaning, reformatting and/or other work.

In some examples, the data is collected from the moment the substrate leaves the cassette until the substrate returns back to the cassette. In some examples, the data can be stored in a single file. In some examples, the file format is self-consistent. In some examples, the data is collected at different frequencies based on the type of data and context. In some examples, the data is formatted using TDMS with encryption. In some examples, a data adapter is used to support legacy data and backward compatibility, to incorporate new data types and to support host messaging/streaming data. Additional details will be described further below.

Referring now to FIG. 3, a fab data collection system 300 for a semiconductor processing system is shown. The fab data collection system 300 includes N substrate processing tools 320-1, 320-2, . . . , and 320-T (where T is an integer) (collectively substrate processing tools 320). Each of the substrate processing tools 320-1, 320-2, . . . , and 320-T includes one or more processing chamber controllers 340-1, 340-2, . . . , and 340-T (collectively processing chamber controllers 340) as described above to control operation of a processing chamber. Examples of data collected by the processing chambers include substrate or wafer data logs, auto preventive maintenance, high-speed data, optical emission spectroscopy (OES), trace data, OES snapshots, pedestal temperature maps and other data, calibration files, equipment constants, sensor data, and/or other data.

Each of the substrate processing tools 320-1, 320-2, . . . , and 320-T may include a transport controller 344-1, 344-2, . . . , and 344-N (collectively transport controllers 344), to control dynamic alignment and to store calibration files, platform trace data logs, equipment constants, transfer module activity and/or other data. Dynamic alignment refers to the location of the substrate relative to other chamber components such as a center of the pedestal, edge ring or other object.

Each of the substrate processing tools 320-1, 320-2, . . . , and 320-T may include a tool system controller 348-1, 348-2, . . . , and 348-N (collectively the tool system controllers 348), respectively. The tool system controllers 348 record lot history, detailed event logs, lot-based alarms, time-based alarms, tool controller health, parts tracking, component history, material scheduling, and other data.

Each of the substrate processing tools 320-1, 320-2, . . . , and 320-T further includes a data diagnostic services computer 350-1, 350-2, . . . , and 350-N (collectively data diagnostic services computers 350) and data storage devices 362-1, 362-2, . . . , and 362-N (collectively data storage devices 362), respectively. In other examples, the data diagnostic services computers 350 may be shared by two or more tools or each tool may include more than one data diagnostic services computer 350. The substrate processing tools 320 are connected by one or more buses such as a tool data bus or network 364-1 and a streaming data bus or network 364-2 to a host server 364.

In some examples, the host server 364 includes a security module 366 and a data selector module 367. The security module 366 provides security such as encryption or password protection. The security module 366 uses encryption or passwords to grant or deny access to data stored by the substrate processing tools 320 and/or to the data selector module 367. The host server 364 further includes a data selector module 365 to allow a user computer 380 to select one or more categories of data from one or more substrate processing tools and filter the data using one or more of the data context fields. In other examples, the security module 366 and/or the data selector module 367 are implemented using separate servers.

The host server 364 is connected by a network 368 such as a WAN or LAN to a machine learning computer 374 and/or one or more user computers 380. The data sets returned by the host server 364 can be made accessible to the machine learning computer 374 for further analysis. In some examples, the machine learning computer 374 includes a security module 375 to control access to the data. The machine learning computer 374 performs machine learning using one or more data files generated by the data collection system as selected by the user. Since the format of the files from the different substrate processing tools is the same, the data can be combined into a single file and analyzed. This allows the same process to be analyzed in multiple machines.

As can be appreciated, the number T of substrate processing tools 320 is not limited. Additionally, the substrate processing tools 320 need not be located at the same facility. In some examples, the equipment manufacturer can be granted access to the data stored by multiple semiconductor manufacturers.

In some examples, the sampling rates of some or all of the data generating devices (other than streaming or HSD devices) can be aligned to a common sampling period and the data is added to a common file (described below) based on the sampling period.

Figure 4C:
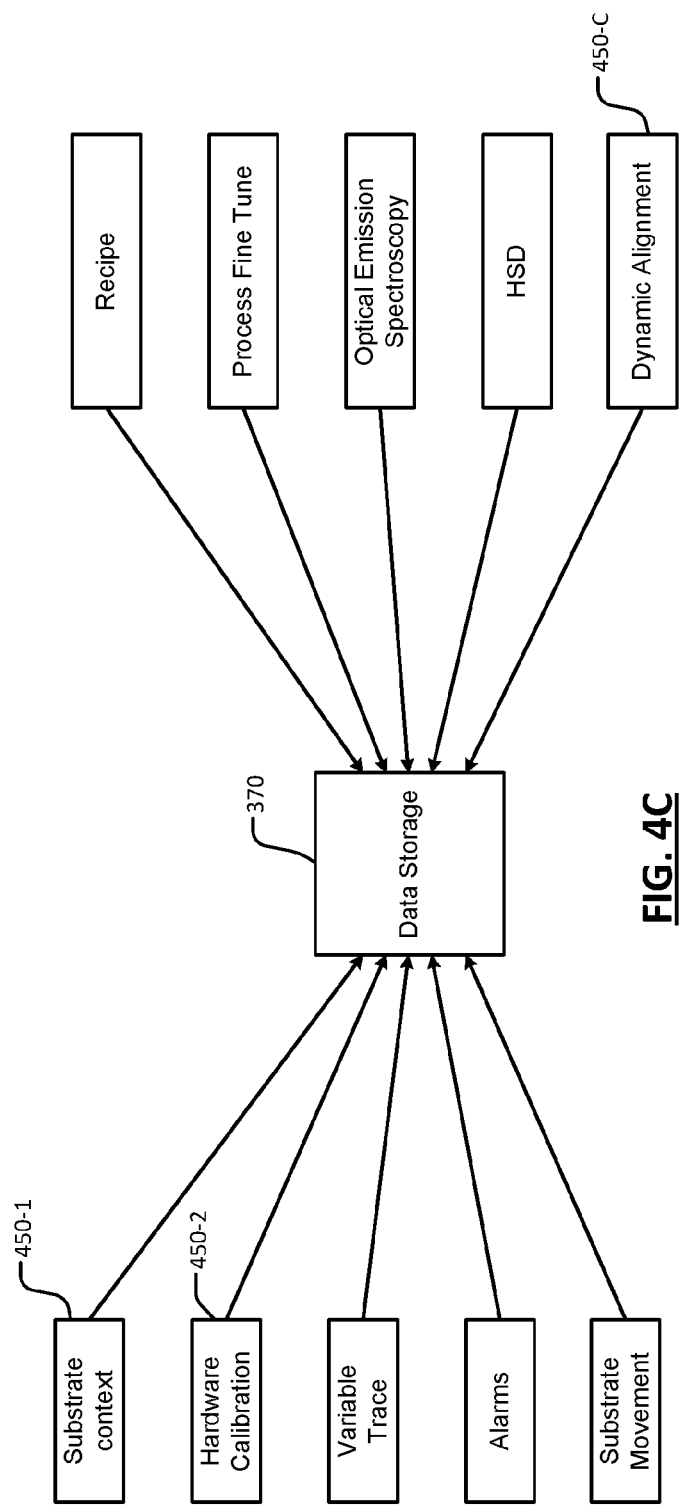

Referring now to FIGS. 4A to 4G, the data collection system according to the present disclosure implements changes to the way that the data is transported, stored and/or formatted. In FIG. 4A, the data was previously stored in one or more large substrate datalog files 400 that store different types of data in various formats. For example, the substrate datalog files 400 may store data including substrate context 410, recipes 414, hardware calibration 418, process finetuning 422 and one or more variable traces 425.

In FIG. 4B, rather than using large substrate datalog files 400 with disparate kinds of data and formats, the data collection system according to the present disclosure breaks the data down into data categories 450-1, 450-2, 450-3, . . . , and 450-C (where C is an integer) and adds contextual data such as material ID, lot ID, process job ID, time, module, etc. in some examples, the data is stored in a common file having a table-like data structure that is analogous to a sparsely populated table. The categories of data are stored in the data structure along with the contextual data.

In FIG. 4C, data storage device 370 is used to store the data structure. In some examples, the data storage device 370 represents a distributed storage system including each of the data storage devices 362 associated with the substrate processing tools 320. In other words, as each of the substrate processing tools 320 operates, it generates the categories of data and contextual data and populates the files in corresponding ones of the data storage devices 362. Then, the data selector module 367 allows the user to pull data from one or more of the data storage devices 362. The process can be repeated one or more times to create a new data set that can be used for further analysis or machine learning without requiring data wrangling or formatting changes.

Figure 4D:
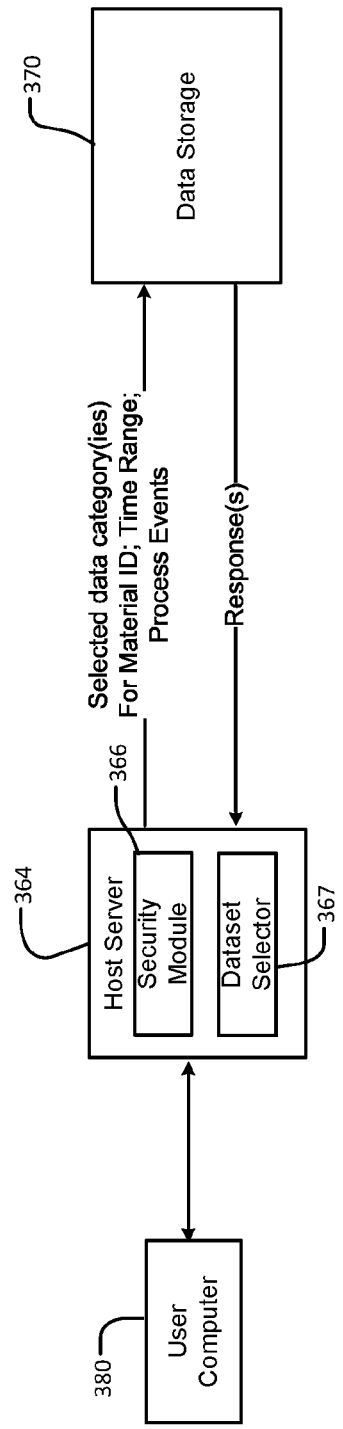
Figure 4E:
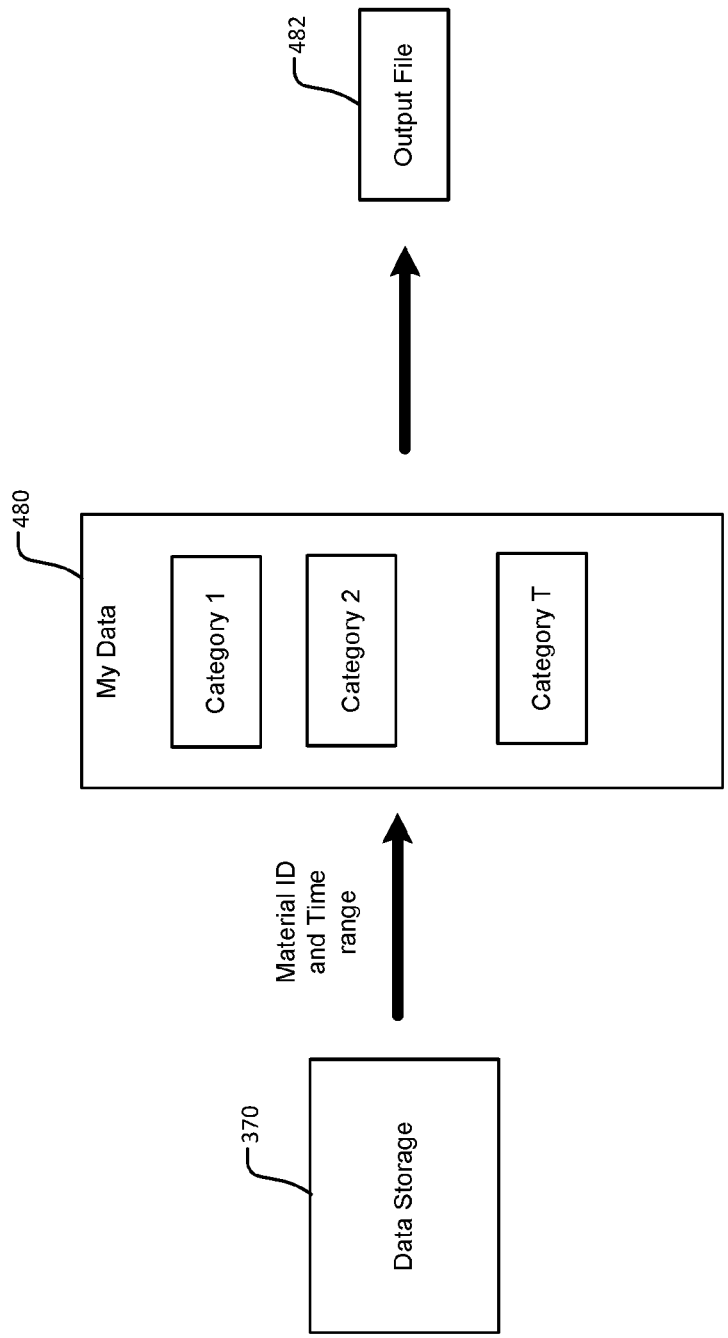

In FIG. 4D, as will be described further below, a semiconductor manufacturer can select a subset of the one or more categories of data and restrict the returned dataset by filtering one or more of the fields in the contextual data. In other words, a user computer 374 generates one or more requests for fab data by specifying one or more categories and filtering one or more contextual data fields. The process can be repeated one or more times to create a new data set for further analysis. In FIG. 4E, an example is shown. In response to a request for data having a material ID, IDs or ID range, time range and/or categories, the data diagnostic services computer selects the categories for the user as limited by the material ID and time range (as shown at 480) from the data storage device 370 and generates an output file 482 for further analysis.

Figure 4F:
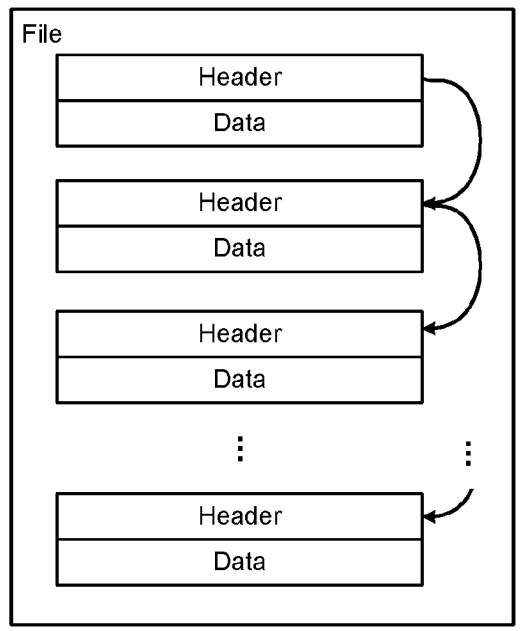
Figure 4G:
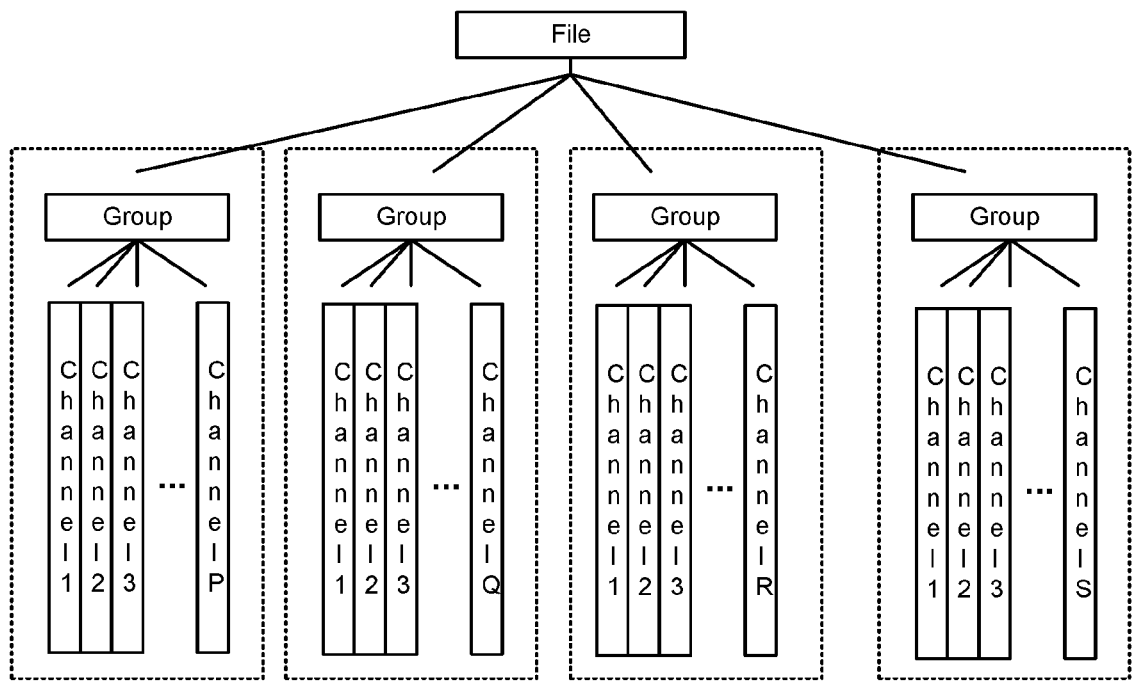

Referring now to FIGS. 4F and 4G, an example of a suitable file format or data structure is shown. In FIG. 4F, the data is appended to a file that includes a linked list. Once data is added to the file, it is not deleted or changed. New data is appended to the file. The appended data includes a header and data. The header of a last entry points to the next entry in the linked list. In FIG. 4G, the file includes a 3-level hierarchy including file, group and channel properties. Each item at each level can include unique properties and there is no limit on the number of groups, channels or channel properties. The groups are similar to tables. Each row represents a point in time or an index. Each column represents data. In some examples, the file includes a TDMS file. TDMS files are binary and compress more efficiently than ASCII files. TDMS files are written and read faster than other formats. Since the files are stored in binary, sensitive data is protected. In some examples, streaming data such as HSD (high speed data up to 1 kHz) and/or OES (optical emission spectroscopy) data can be stored in the file or stored in a separate substrate datalog file.

Figure 5:
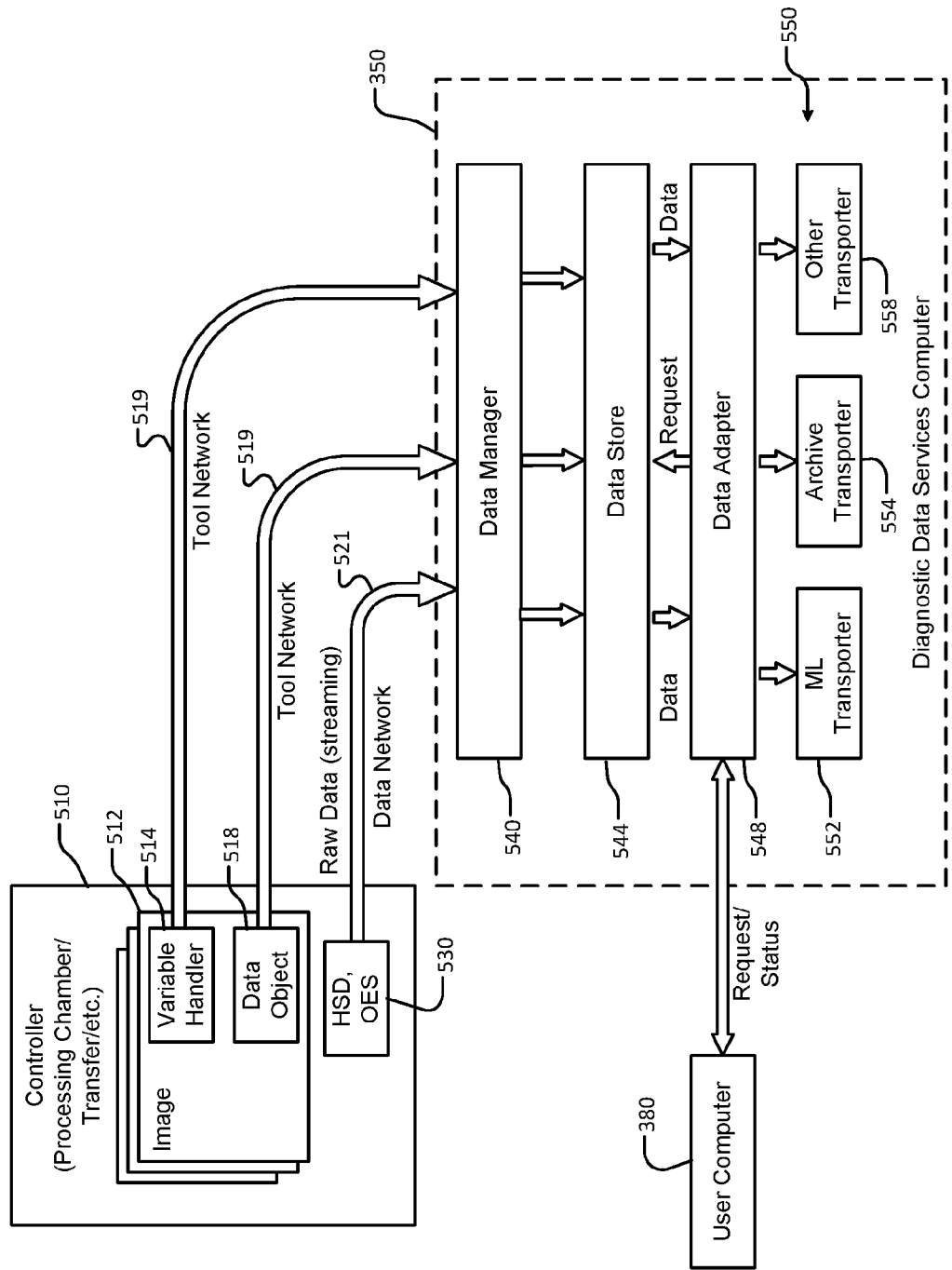
FIG. 5 is a functional block diagram illustrating an example of flow of data from a source to the data diagnostic services computer according to the present disclosure.

Referring now to FIG. 5, an example of data handling and processing by the data diagnostic services computer is shown. A controller 510 (such as one of the processing chamber controllers, tool system controllers or transfer module controllers described above) includes one or more images 512. In some examples, the images 512 include Smalltalk images, although other types can be used. The images 512 include a variable data handler 514 and/or data object handler 518. In some examples, the variable data handler 514 and/or a data object handler 518 output data via a tool network bus 519. Other data such as HSD and/or OES (at 530) is transported by a data network bus 521 and may include raw streaming data.

The data diagnostic services computer 350 includes a data manager 540 that receives data flows from the controllers 510. The data manager 540 outputs the data flows to the data store 544. A data adapter 548 receives requests from a user computer 380. The data adapter 548 outputs the request to the data store 544 and receives the data back from the data store 544. The data adapter 548 adapts the data as needed for the destination and outputs the data to one of a plurality of transporters 550. Adapting the data may include further formatting and/or other operations for the designated transport target. The selected one of the transporters forwards or transports the data to the correct target (for example machine learning, archive or FTP). In some examples, the transporter 550 includes at least one of a machine learning (ML) transporter 552, an archive transporter 554, a file transfer protocol (FTP) transporter (not shown) or another transporter 558.

Figure 6:
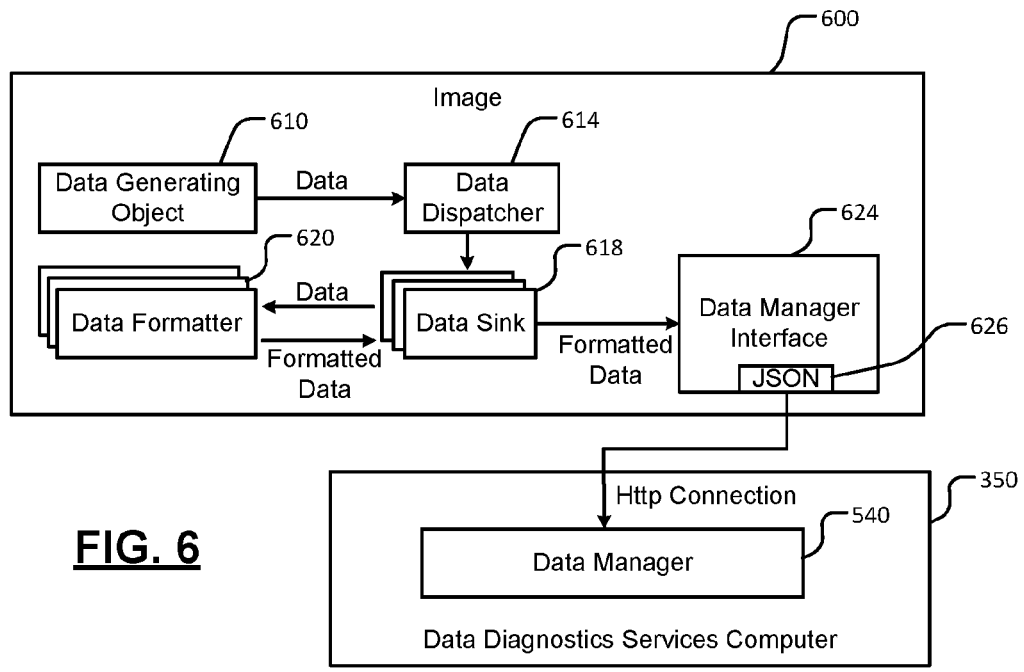
FIG. 6 is a functional block diagram of an example of handling and formatting of the data.

Referring now to FIG. 6, an image 600 includes a data generating object 610 that generates data that is output to a data dispatcher 614. In some examples, the image 600 includes a Smalltalk image and the data generating object 610 is a Smalltalk object, although other types of images and objects can be used. In some examples, the data generating object 610 generates data relating to a recipe, process events, hardware calibration, process fine tuning, etc.

The data dispatcher 614 forwards the data from the data dispatcher 614 to one of a plurality of data sinks 618 based on the data category. One of the plurality of data sinks 618 sends the data to a data formatter 620 that applies one of the plurality of data formats to the data. In some examples, the data formatter 620 applies a TDMS compatible format to the data.

The data formatter 620 returns the formatted data to the data sink 618. The data sink 618 forwards the formatted data to a data manager interface 624. The data manager interface 624 converts the formatted data into a string (such as Javascript Object Notation (JSON)) and sends the data to the data manager 540 of the data diagnostic services computer 350.

Figure 7:
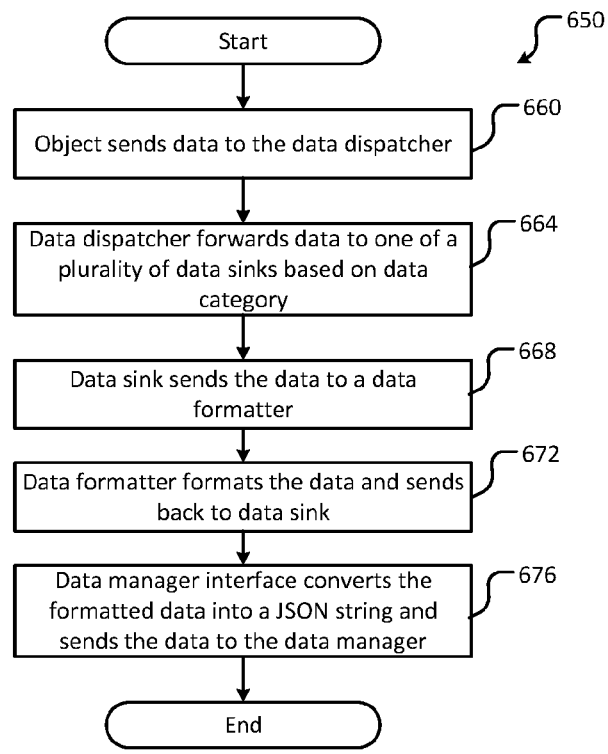
FIG. 7 is a flowchart illustrating an example of a method for data handling and formatting.

Referring now to FIG. 7, the method 650 for operating the image 600 is shown. At 660, the data generating object 610 sends data to the data dispatcher 614. The data dispatcher 614 forwards the data to one of a plurality of data sinks 618 based on the data category at 664. At 668, the data sink 600 sends the data to the data formatter 620. At 672, the data formatter 620 formats the data (using a format based on the category) and sends the data back to the data sink 618. At 676, the data manager interface 624 converts the formatted data and sends the data to the data manager 540.

Figure 8:
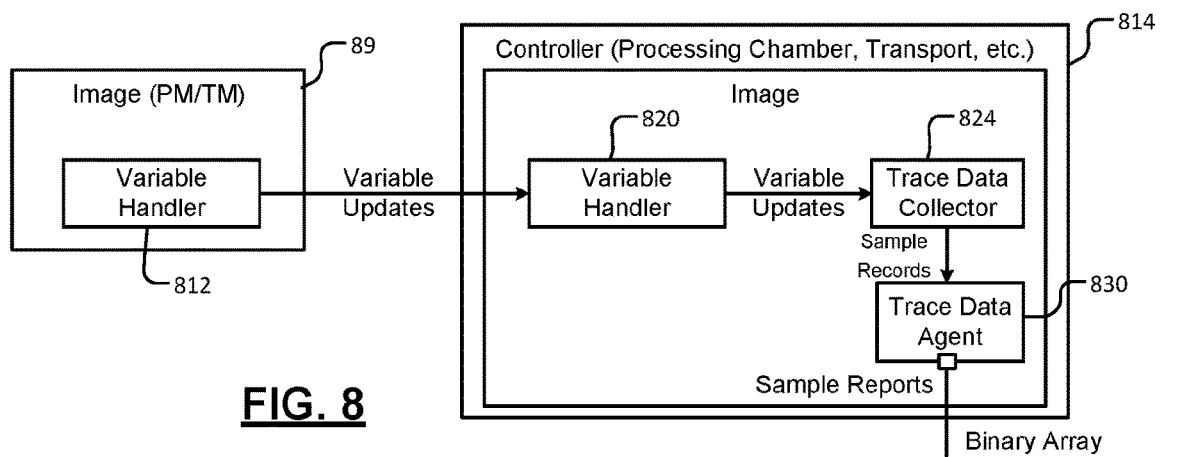
FIG. 8 is a functional block diagram of an example of a system for updating variables and generating trace data.

Referring now to FIG. 8, an image 810 (associated with one of the controllers) includes a variable handler 812 that generates variable updates that are output to a variable handler 820 of an image 822. For example, variable updates for the processing chambers are sent. The variable handler 820 generates variable updates (such as variable updates for the substrate processing tool) that are output to a trace data collector 824. The trace data collector 824 outputs sample records (such as tool sample records) to a trace data agent 830. The trace data agent 830 generates sample reports that are output is a binary array to the data manager 540 of the data diagnostic services computer 350. In some examples, the trace data agent 830 outputs binary data such as an array via streaming sockets.

Figure 9:
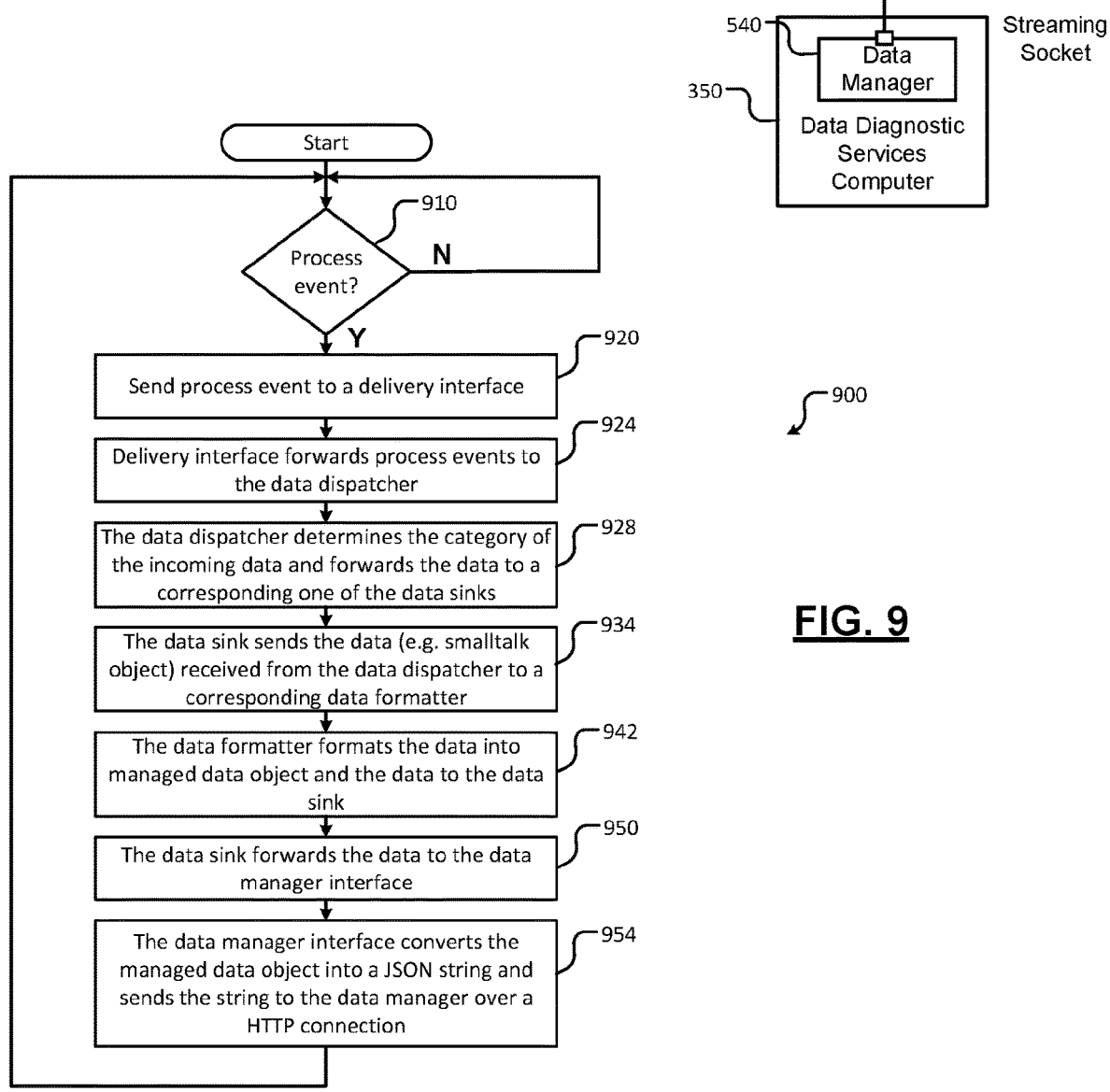
FIG. 9 is a flowchart of an example of a method for data handling.

Referring now to FIG. 9, a method 900 is shown. When a process event occurs as determined at 910, the process event is sent to a delivery interface at 920. At 924, the delivery interface forwards the process events to the data dispatcher. At 928, the data dispatcher determines the category of the incoming data and forwards the data to a corresponding one of the data sinks. At 934, the data sink sends the data (such as a Smalltalk object) received from the data dispatcher to a corresponding data formatter. At 938, the data formatter formats the data into managed data object and sends the data to the data sink. At 950, the data sink forwards the data to the data manager interface. At 954, the data manager interface converts the managed data object into a string (such as a JSON string) and sends the string to the data manager over a connection such as an HTTP connection.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A data collection system for semiconductor manufacturing, comprising:
   T substrate processing tools, wherein each of the T substrate processing tools includes:
      N processing chambers, wherein each of the N processing chambers includes a processing chamber controller configured to receive a plurality of different types of data during operating of the corresponding one of the N processing chambers,
      wherein the plurality of different types of data have different formats,
      wherein the processing chamber controller is further configured to format the plurality of different types of data into formatted data, and
      wherein T and N are integers; and
   a data diagnostic services computer configured to:
      receive and store the formatted data as categories in a common file having a table-like data structure including rows with contextual data; and
      in response to a request, generate an output file including a subset of the data from the common file.

2. The data collection system of claim 1, wherein:
   the contextual data includes a material identification field and a time field; and
   the plurality of different types of data comprise at least three or more data types selected from a group consisting of recipes, hardware calibration, process fine-tuning, optical emission spectroscopy, high speed data, and variable traces.

3. The data collection system of claim 2, wherein the data diagnostic services computer is configured to generate the output file based on at least one of:
   a subset of the categories;
   a subset of the material identification field; and
   a subset of the time field.

4. The data collection system of claim 1, wherein the common file has a three-level hierarchy including file, group and category.

5. The data collection system of claim 1, wherein the common file has a technical data management solution (TDMS) format.

6. The data collection system of claim 5, wherein data is stored in the common file in binary format.

7. The data collection system of claim 1, further comprising a machine learning computer configured to communicate with the diagnostics data services computer and to perform machine learning on data in the output file.

8. The data collection system of claim 1, wherein the processing chamber controller includes:
   a data generating object configured to transmit the plurality of different data types;
   a data dispatcher configured to receive the plurality of different data types from the data generating object;
   a plurality of data sinks, wherein each of the plurality of data sinks is configured to receive a corresponding one of the plurality of different data types from the data dispatcher;
   a plurality of data formatters, wherein each of the plurality of data formatters is configured to receive the corresponding one of the plurality of different data types from the data sink and to output the formatted data back to the corresponding one of plurality of data sinks; and
   a data interface manager configured to forward the formatted data from the plurality of data sinks to the data diagnostics services computer.

9. The data collection system of claim 1, wherein the data diagnostic services computer includes:
   a data manager configured to receive the formatted data from the processing chamber controller; and
   a data store configured to store and control access to the common file.

10. The data collection system of claim 9, further comprising a data adapter configured to receive the request and to generate the output file.

11. The data collection system of claim 10, wherein the data adapter is further configured to adapt the output file to one of a plurality of data transporters.

12. The data collection system of claim 11, wherein the plurality of data transporters include at least one of a file transfer protocol (FTP) transporter, a machine learning transporter, and an archive transporter.

13. The data collection system of claim 1, further comprising:
   a host server including a file selector configured to select R portions of data from R output files of R of the T substrate processing tools, wherein R is an integer greater than one and less than or equal to T; and
   a machine learning computer configured to combine and perform machine learning on data in the R output files.

14. A data collection method for semiconductor manufacturing, comprising:
   receiving a plurality of different types of data during operating of ones of N processing chambers of T substrate processing tools,
   wherein T and N are integers greater than zero, and
   wherein the plurality of different types of data have different formats;
   formatting the plurality of different types of data into formatted data;
   storing the formatted data as categories in a common file having a table-like data structure including rows with contextual data; and
   in response to a request, generating an output file including a subset of th the data from the common file.

15. The data collection method of claim 14, wherein:
   the contextual data includes a material identification field and a time field; and
   the plurality of different types of data comprise at least three or more data types selected from a group consisting of recipes, hardware calibration, process fine-tuning, optical emission spectroscopy, high speed data, and variable traces.

16. The data collection method of claim 15, wherein generating the output file includes generating the output file based on at least one of:
   a subset of the categories;
   a subset of the material identification field; and
   a subset of the time field.

17. The data collection method of claim 14, wherein the common file has a three-level hierarchy including file, group and category.

18. The data collection method of claim 14, wherein the common file has a technical data management solution (TDMS) format.

19. The data collection method of claim 18, wherein the data is stored in the common file in binary format.

20. The data collection method of claim 14 further comprising performing machine learning on data in the output file.

\* \* \* \* \*